United States Patent [19]

Gounji et al.

[11] 4,314,216

[45] Feb. 2, 1982

[54] MECHANICAL FILTER

[75] Inventors: Takashi Gounji, Kawasaki; Yoshihiko Kasai, Yokohama; Kenji Shirai, Ebina, all of Japan

[73] Assignee: Fujitsu Limited, Kawasaki, Japan

[21] Appl. No.: 92,855

[22] Filed: Nov. 9, 1979

[30] Foreign Application Priority Data

Nov. 13, 1978 [JP] Japan .................. 53-139648
Dec. 4, 1978 [JP] Japan .................. 53-149866
Dec. 4, 1978 [JP] Japan .................. 53-149868

[51] Int. Cl.³ ........................ H03H 9/50; H03H 9/24
[52] U.S. Cl. .................................. 333/198; 333/197
[58] Field of Search ........................... 333/186–189, 333/197–200

[56] References Cited

U.S. PATENT DOCUMENTS 3,372,351 3/1968 Börner et al. .................. 333/199
3,949,326 4/1976 Yano et al. .................... 333/198

Primary Examiner—Marvin L. Nussbaum
Attorney, Agent, or Firm—Staas & Halsey

[57] ABSTRACT

A mechanical filter having at least a pair of mechanical vibrators which are arrayed approximately in parallel with each other in regard to their longitudinal axes, and two couplers which are coupled to the pair of mechanical vibrators. According to the mechanical filter one of the pair of mechanical vibrators undergoes the vibration of the order of an odd number and the other one undergoes the vibration of the order of an even number in the same vibration mode, or both of them undergo the vibration of the order of an odd number or even number in the same vibration mode. Furthermore, these mechanical vibrators have such a mechanical size that they will vibrate at their required order of vibration and at their respective resonance frequencies, and the two couplers are so constructed that they will be differentially coupled to the pair of mechanical vibrators approximately at right angles therewith.

15 Claims, 30 Drawing Figures (a)  (b)

(a)  (b)

MECHANICAL FILTER

BACKGROUND OF THE INVENTION (1) Field of the Invention

The present invention relates to a mechanical filter and specifically to a mechanical filter of the type of differential coupling.

(2) Prior Art

A mechanical filter is commonly used as a band-pass filter and deals with transformation of electrical signals with ultrasonic waves as a medium, and vice versa. This type of filter exhibits numerous advantages, such as having a high Q compared with electric elements L and C, while maintaining or increasing stability and enabling the device itself to be of a small construction. Because of these advantages, the mechanical filter has been used as a channel filter for channel translating equipment or as a filter for navigation receivers or for automatic train control systems.

A mechanical filter of the simplest form consists of a pair of mechanical vibrators that are coupled together by means of a single coupler. Even mechanical filters having a complicated construction are obtained by combining mechanical filters of the above-mentioned basic form.

Many of these mechanical filters employ a differential coupler which is effective when the mechanical filters are used as narrow-band filters. The reasons are discussed below.

In general, the equivalent stiffness of a coupler required for a narrow-band mechanical filter decreases with the decrease in the band width of the filter. The equivalent stiffness, on the other hand, depends upon the shape and size of the coupler and the constant of the material. For instance, a small equivalent stiffness can be obtained if the propagation velocity and the diameter of the coupler are decreased and the length of the coupler is increased. Because of the requirements for the mechanical strength of mechanical filters, however, a limitation is imposed on the length of the coupler. Furthermore, a limitation is imposed on the propagation velocity of the coupler, although it can be varied to some extent by varying the temperature of the heat treatment for the coupler.

In view of the above, the only way to produce a small equivalent stiffness when the coupling position of the coupler is constant, is to reduce the diameter of the coupler. For example, if it is intended to construct a mechanical filter using a single coupler, the mechanical strength of the filter inevitably decreases. On the other hand, when a mechanical filter is to be constructed using two couplers based upon the aforementioned differential coupling, such a mechanical filter can be obtained with the two couplers having relatively large diameters even though their equivalent stiffness may be considerably small. In other words, it is possible to easily obtain a narrow-band mechanical filter having increased mechanical strength. The second advantage is with regard to the design and manufacturing. Generally, it is desired that the mechanical filters be constructed using conventional standardized couplers from the viewpoint of economy and ease of manufacturing. However, if a mechanical filter is produced using a single coupler, the equivalent stiffness of the coupler varies depending upon the kind of the standardized product, and this variation limits freedom of the design. On the other hand, when two couplers are employed, freedom of the design of the equivalent stiffness is not limited, depending upon the combination of the two couplers.

The foregoing mentioned the principal advantages of using differential couplers to manufacture mechanical filters. A variety of methods have heretofore been proposed to obtain a differential coupling of practical mechanical filters.

A first method consists of connecting a coupler to a pair of mechanical vibrators, which vibrate in the same mode and at the order of the same number, at portions at which the mechanical vibrators vibrate in directions which differ by 180° from each other. A second method consists of connecting a coupler to a pair of vibrators, which vibrate in different vibration modes and at orders of different numbers, at portions at which the mechanical vibrators vibrate in directions which differ by 180° from each other.

The above two methods have advantages and disadvantages. Referring to the first method, for example, the two mechanical vibrators undergo vibration in the same mode and at the order of the same number. Therefore, the two mechanical vibrators must have the same size and shape. Accordingly, when the mechanical filter is manufactured, mechanical vibrators having the same size and same shape may be used. However, the couplers must be connected in a tilted direction or in a diagonal direction with respect to the mechanical vibrators, and this presents a problem from the standpoint of manufacturing the mechanical filter, and also a high accuracy of the mechanical filter construction can not be expected.

Referring to the second method, the two couplers are connected to a pair of mechanical vibrators at right angles therewith, enabling the mechanical filter to be easily manufactured while maintaining increased precision. However, since the two mechanical vibrators vibrate at different modes, the two vibrators must be formed in different shapes. Besides, since the two mechanical vibrators vibrate at different modes as mentioned above, they must be made of different materials. Moreover, in many cases, the two couplers are connected to the upper and lower surfaces of the mechanical vibrators which requires an increased number of manufacturing steps.

OBJECTS AND SUMMARY OF THE INVENTION

A principal object of the present invention is to provide a mechanical filter of the differential coupling type having a novel construction, which is free from the defects inherent in its conventional counterparts.

Another object of the present invention is to provide a mechanical filter in which two couplers, including a differential coupler, can be coupled to a pair of mechanical vibrators at right angles therewith, the pair of mechanical vibrators being allowed to vibrate in the same mode of vibration, and in which the two couplers are allowed to be connected to the surface of only one side of each mechanical vibrator, thereby achieving easy manufacture and increased precision of the mechanical filter.

A further object of the present invention is to provide a pole-type mechanical filter which is composed of mechanical vibrators that vibrate in the same mode of vibration and that are made of the same materials, and in which a main coupler for transmitting the signals in phase and a bridging coupler for forming a pole are arrayed approximately at right angles to the mechanical vibrators, which permits the mechanical filter to be manufactured easily and to maintain increased precision.

According to the present invention, therefore, a mechanical filter comprises at least a pair of mechanical vibrators which are arrayed approximately parallel to each other with respect to their longitudinal axes and two couplers connected to the pair of mechanical vibrators, wherein one of the pair of mechanical vibrators vibrates at the order of an odd number and the other one vibrates at the order of an even number in the same mode of vibration, and the mechanical vibrators have such a mechanical size that they will vibrate at their required order of vibration and at their respective resonance frequencies, and the two couplers are so constructed that they will be differentially coupled to the pair of mechanical vibrators approximately at right angles therewith.

Furthermore, according to the present invention, the mechanical filter comprises at least a pair of mechanical vibrators which are so arrayed that their longitudinal axes are nearly parallel to each other and which vibrate at nearly equal resonance frequencies at the order of an odd number or even number, a first coupler which is arrayed approximately at right angles to the pair of mechanical vibrators to couple the pair of mechanical vibrators together in phase, and a second coupler which is arrayed approximately at right angles to the pair of mechanical vibrators to couple the pair of mechanical vibrators in antiphase, wherein the mechanical vibrators are both resonators or transducers, or one of them is a resonator and the other one is a transducer.

Moreover, according to the present invention, the mechanical filter comprises a pole-type filter with at least three or more mechanical vibrators that are so arrayed that their longitudinal axes are nearly parallel to each other, a main coupler for coupling each of the mechanical vibrators in phase together, and a bridging coupler which connects, in antiphase, at least a pair of mechanical vibrators which are not adjacent to each other, wherein the pair of mechanical vibrators connected by the bridging coupler undergo vibration of the order of any number and in the same mode of vibration and, further, possess nearly the same resonance frequencies, and the main coupler and the bridging coupler are connected to the mechanical vibrators approximately at right angles therewith.

Further features and advantages of the present invention will be apparent from the ensuing description with reference to the accompanying drawings to which, however, the scope of the invention is in no way limited.

DETAILED DESCRIPTION OF THE INVENTION

Figure 1A:
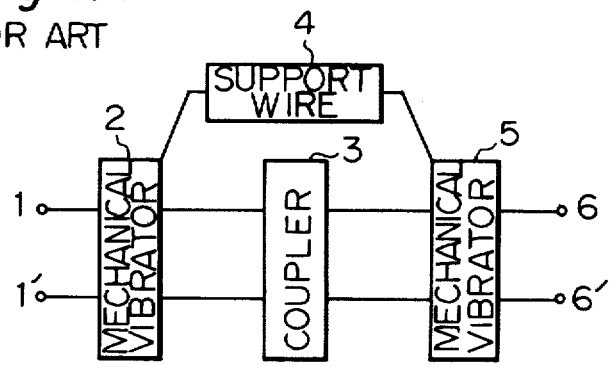
FIG. 1A illustrates the construction of a conventional mechanical filter.

The invention is explained below in detail in comparison with the prior techniques and a coupler of a mechanical filter that serves as a background to the invention. First, a conventional mechanical filter consisting of a pair of mechanical vibrators, a coupler and a support wire is illustrated in FIG. 1A. In the mechanical filter illustrated in FIG. 1A, an electric input signal or a mechanical input signal is applied to input terminals 1, 1'. A mechanical vibrator 2 exhibits different functions depending upon whether the input signal is an electric signal or a mechanical signal. When the applied signal is an electric input signal, the mechanical vibrator 2 serves as a transducer which converts the electric signal into a mechanical signal that is transmitted to a mechanical vibrator 5 via a coupler 3. On the other hand, when the signal applied to the mechanical vibrator 2 is a mechanical input signal, the mechanical vibrator 2 serves as a resonator. The mechanical signal is transmitted to the mechanical vibrator 5 via the coupler 3. When the mechanical vibrator 5 is a transducer, the transmitted mechanical signal is converted into an electric signal which reaches output terminals 6, 6' in the form of an electric output signal. However, when the mechanical vibrator 5 is a resonator, the transmitted mechanical signal passes through the mechanical vibrator 5 and reaches the output terminals 6, 6' in the form of a mechanical output signal. A support wire 4 is employed in order to hold the mechanical vibrators 2 and 5.

Figure 1B:
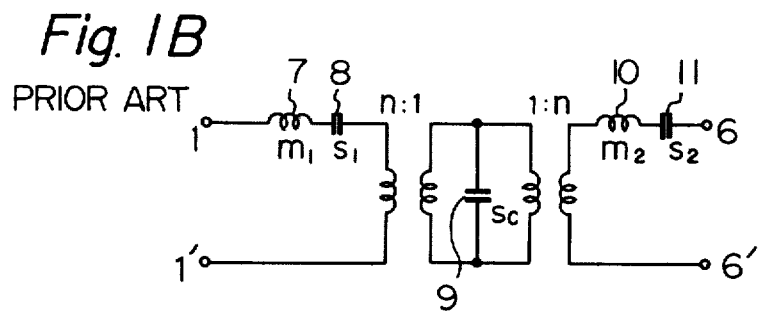
FIGS. 1B and 1C illustrate equivalent circuits of the mechanical filter of FIG. 1A.
Figure 1C:
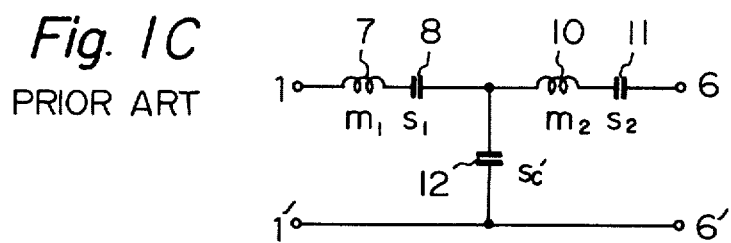

FIG. 1B illustrates a generalized equivalent electric circuit of the mechanical filter illustrated in FIG. 1A. The mechanical vibrator 2 in FIG. 1A corresponds to an equivalent mass $m_1(7)$ and an equivalent stiffness $S_1(8)$. The mechanical vibrator 5 corresponds to an equivalent mass $m_2(10)$ and an equivalent stiffness $S_2(11)$. Further, the coupler 3 corresponds to an equivalent stiffness $Sc(9)$. The symbol n represents the transformation ratio of an ideal transformer, which is determined by the coupling position of the coupler coupled to the mechanical vibrators. FIG. 1C illustrates another equivalent circuit which is further equivalently transformed from the circuit of FIG. 1B. In FIG. 1C, the portions corresponding to the same portions of FIG. 1B are denoted by the same reference numerals, and Sc'(12) denotes an equivalent stiffness. The following relation occurs between the equivalent stiffness Sc'(12) and the equivalent stiffness Sc(9) of FIG. 1B.

$$Sc' = n^2 Sc \qquad (1)$$

Figure 2A:
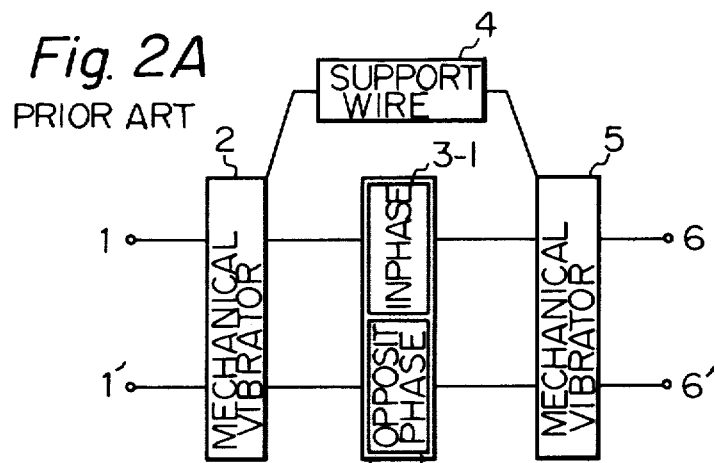
FIG. 2A illustrates the construction of a mechanical filter employing a differential coupler.
Figure 2B:
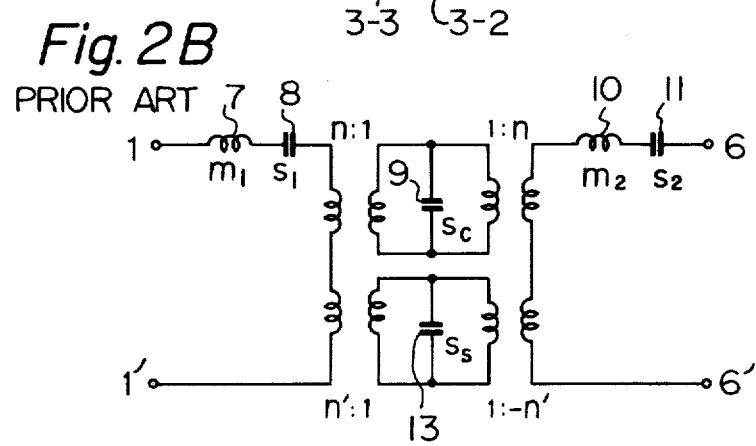
FIGS. 2B and 2C illustrate equivalent circuits of the mechanical filter of FIG. 2A.
Figure 2C:
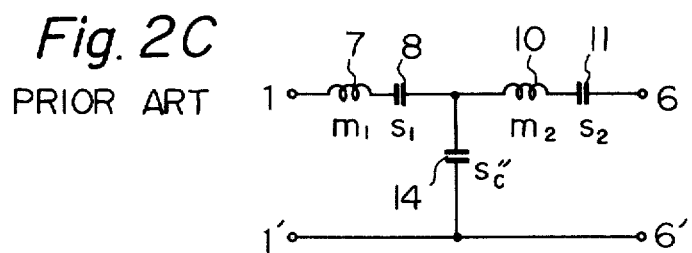

FIG. 2A is a diagram illustrating the construction of a mechanical filter with a differential coupler applied to the mechanical filter illustrated in FIG. 1A. In FIG. 2A, the portions corresponding to the same portions of FIG. 1A are denoted by the same reference numerals. Further, the mode of operation is the same as that of the mechanical filter illustrated in FIG. 1A. Here, however, the description refers to couplers 3-1 and 3-2. The phases of the mechanical signals transmitted through the coupler 3-1 and the coupler 3-2 differ from each other by 180°. The mechanical signals transmitted to the mechanical vibrator 5 are expressed by the sum of the mechanical signals transmitted through the couplers 3-1 and 3-2. Therefore, the two couplers 3-1 and 3-2 can be equivalently replaced by a single coupler 3-3. FIG. 2B illustrates a generalized electric equivalent circuit of the mechanical filter of FIG. 2A. In FIG. 2B, the portions corresponding to the same portions of FIG. 1B are denoted by the same reference numerals. The coupler 3-2 in FIG. 2A corresponds to an equivalent stiffness Ss(13). Symbols n' and −n' denote transformation ratios of ideal transformers corresponding to the connecting positions with respect to the mechanical vibrators 2 and 5 of the coupler 3-2, and a negative sign denotes that the transformer operates in a differential manner. FIG. 2C illustrates an equivalent circuit which is further transformed from the circuit of FIG. 2B, in which the portions corresponding to the same portions of FIG. 2B are denoted by the same reference numerals. Further, in FIG. 2C, Sc''(14) represents an equivalent stiffness. The following relation is maintained between the equivalent stiffness Sc''(14), equivalent stiffness Sc(9) of FIG. 2B and equivalent stiffness Ss(13).

$$Sc'' = n^2 Sc - (n')^2 Ss \qquad (2)$$

The equivalent stiffness Sc''(14) corresponds to the coupler 3—3 in FIG. 2A.

On the other hand, th equivalent stiffness Sc of a longitudinal vibrating coupler generally establishes the following relation between the diameter dc of the coupler and the length lc of the coupler.

$$Sc \propto dc^2 / lc \qquad (3)$$

Furthermore, the following proportional relation is maintained between the equivalent stiffness Sc of the coupler and the specific band width B(=Δf/fo, fo: center frequency, Δf: 3dB band width) of the filter.

$$B \propto Sc \qquad (4)$$

From the equations (2), (3) and (4), it is clear that the aforementioned advantages can be obtained by using a differential coupler in the mechanical filter.

The conventional methods for obtaining mechanical filters using differential coupling by connecting an additional coupler to the mechanical filter which consists of a pair of mechanical vibrators which are arrayed nearly parallel to each other in the longitudinal direction and a coupler connected to the mechanical vibrators can be classified into two groups.

Figure 3A:
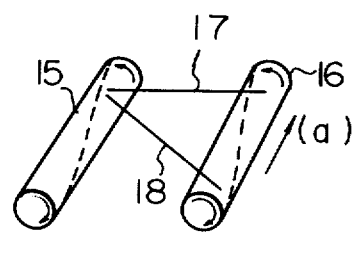
FIGS. 3A, 3B and 4 are views illustrating embodiments of conventional mechanical filters.
Figure 3B:
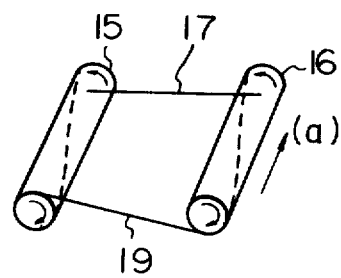

As illustrated in FIG. 3A, the first method consists of connecting a coupler to a pair of mechanical vibrators, which vibrate in the same mode and at the same order of the same number, at positions at which the mechanical vibrators vibrate in directions different by 180° from each other. In this case, the couplers are connected to the mechanical vibrators at angles other than right angles as illustrated in FIG. 3A, or the couplers are connected in a diagonal manner as illustrated in FIG. 3B. In FIG. 3A, reference numerals 15 and 16 denote mechanical vibrators which undergo the torsional vibration of the first order in the same mode of vibration, 17 denotes a coupler for transmitting the signals in phase, and 18 denotes a differential coupler for transmitting the signals in antiphase. The dotted lines and arrows in the drawing represent the mode of torsional vibration and directions of vibration respectively. Further, arrow (a) denotes the longitudinal direction of the mechanical vibrators. In this example, the differential coupler 18 is connected to the mechanical vibrators 15 and 16 at angles other than right angles. FIG. 3B illustrates an example in which the differential coupler 19 is connected to the mechanical vibrators 15 and 16 in a diagonal manner.

Figure 4:
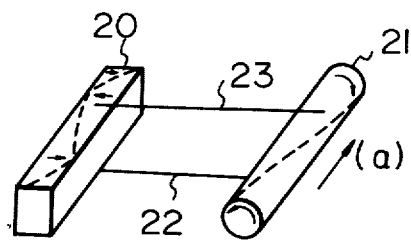

The second method consists of connecting a coupler to a pair of mechanical vibrators, which vibrate in different modes of vibration and at the orders of different numbers, at positions at which the mechanical vibrators vibrate in directions which are different by 180° from each other, as illustrated in FIG. 4. In this case, the coupler is connected to the respective mechanical vibrators at right angles. An embodiment is illustrated in FIG. 4 in which reference numeral 20 denotes a mechanical vibrator which vibrates in a flexural vibration mode at the second order, 21 denotes a mechanical vibrator which vibrates in a torsional vibration mode at the first order, 22 denotes a coupler for transmitting the signals in phase, and 23 denotes a differential coupler for transmitting the signals in antiphase. The dotted lines and arrows in FIG. 4 represent the different modes of vibration and directions of vibration, respectively.

The characteristic feature of a mechanical filter according to the present invention are that two couplers including a differential coupler are connected to mechanical vibrators at right angles so as to simplify the manufacturing steps and to attain a high degree of precision, the pair of mechanical vibrators being designed to vibrate in the same mode of vibration and the two couplers being connected to the only one side of the surfaces of the pair of mechanical vibrators. The mechanical filter of the present invention is based upon the following fundamental concept. Namely, the pair of mechanical vibrators vibrate in the same mode of vibration but at the orders of different numbers. Moreover, the sizes of the mechanical vibrators are so adjusted that the resonance frequencies are nearly equal at a desired order of vibration. The mechanical vibrators on the input side and on the output side may vibrate at the order of either an odd number or an even number.

Figure 5A:
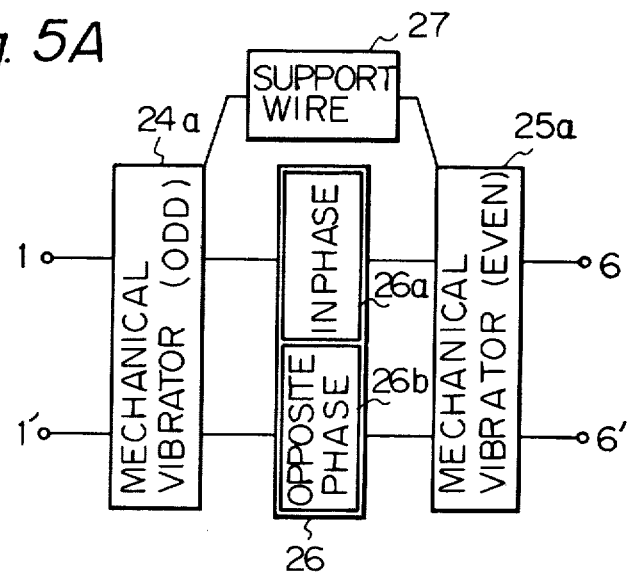
FIGS. 5A, 5B, 5C and 5D are diagrams illustrating mechanical filters according to the present invention.
Figure 5B:
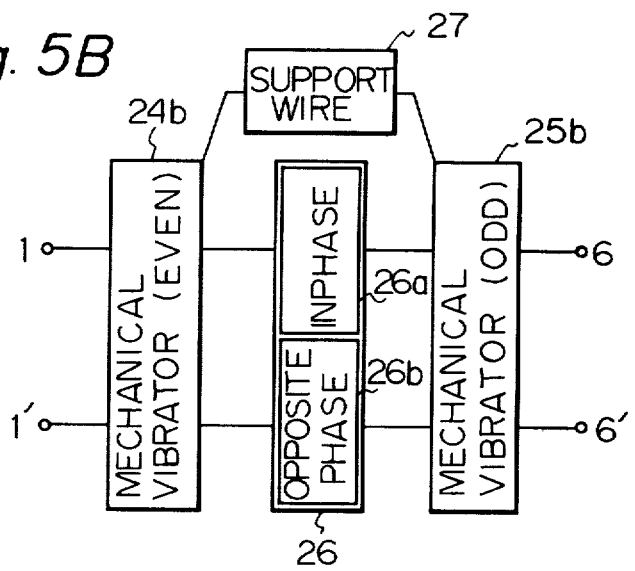
Figure 5C:
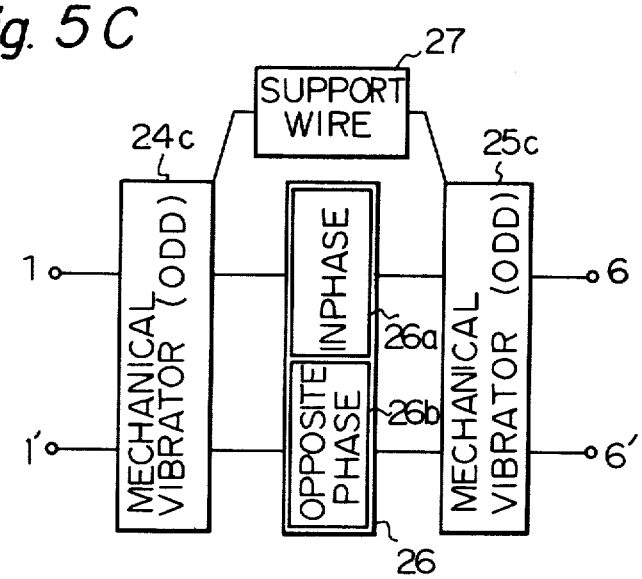
Figure 5D:
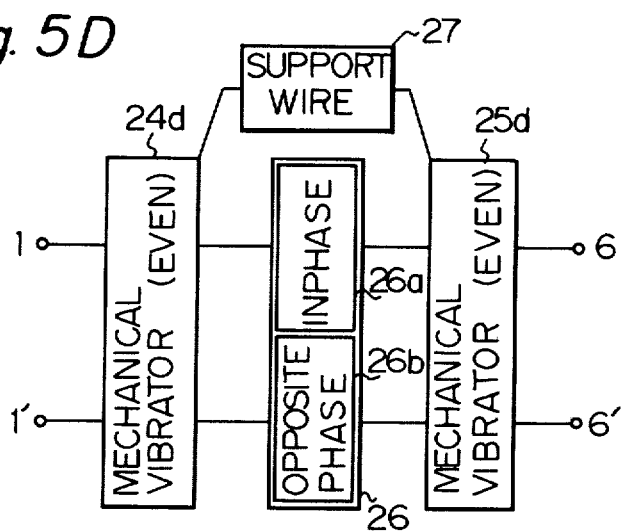

FIGS. 5A to 5D are diagrams illustrating the mechanical filters of the present invention. In the diagrams in FIG. 5A, the mechanical vibrator on the input side vibrates at the order of an odd number and the mechanical vibrator on the output side vibrates at the order of an even number. In FIG. 5A, reference numeral 24a denotes a mechanical vibrator which vibrates at the order of an odd number, 25a denotes a mechanical vibrator which vibrates at the order of an even number, 26a denotes a coupler which transmits signals in phase, 26b denotes a differential coupler which transmits signals in antiphase, 26 denotes an equivalent coupler which includes the couplers 26a and 26b, and 27 denotes a support wire. The mechanical vibrators 24a and 25a vibrate in the same mode of vibration. In the diagram in FIG. 5B, the vibration order of the mechanical vibrators on the input and output sides are reversed as compared with those of FIG. 5A. In FIG. 5B, reference numeral 24b denotes a mechanical vibrator on the input side which vibrates at the order of an even number, and 25b denotes a mechanical vibrator on the output side which vibrates at the order of an odd number. The remaining portions correspond to the same reference numerals as in FIG. 5A. FIG. 5C illustrates the case when the mechanical vibrators 24c and 25c on the input side and on the output side vibrate at the order of an odd number, and FIG. 5D illustrates the case when the mechanical vibrators 24d and 25d on the input side and on the output side vibrate at the order of an even number.

In summary, the present invention can be applied to any mode of vibration and to any combination of vibration orders. Moreover, the mechanical vibrators on the input and output sides may be either resonators or transducers. Namely, if the orders of an odd number and an even number are taken into consideration, the mechanical vibrators on the input side and the output side can be combined in four ways, i.e., resonator-resonator, resonator-transducer, transducer-resonator, and transducer-transducer. Below are specific illustrations of a few embodiments of the present invention as applied to mechanical filters.

Figure 6A:
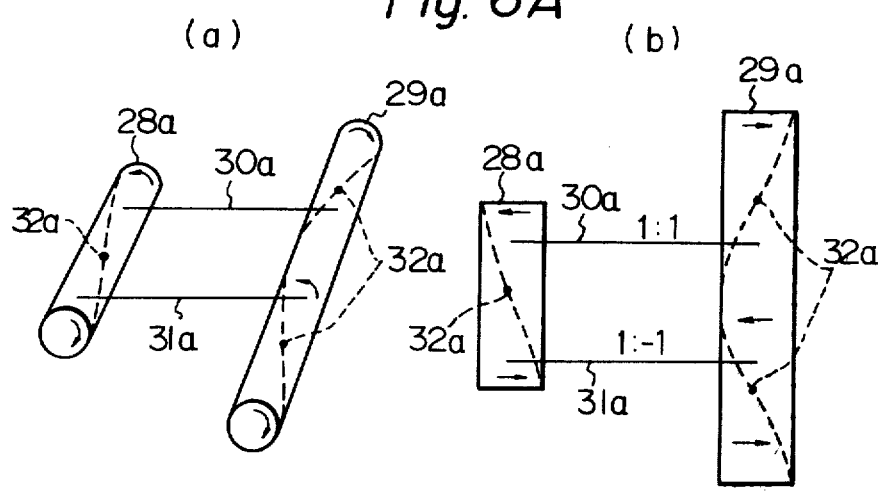
FIGS. 6A, 6B and 6C are views illustrating embodiments of the present invention as applied to a mechanical filter which has mechanical vibrators of the torsional vibration type.
Figure 6B:
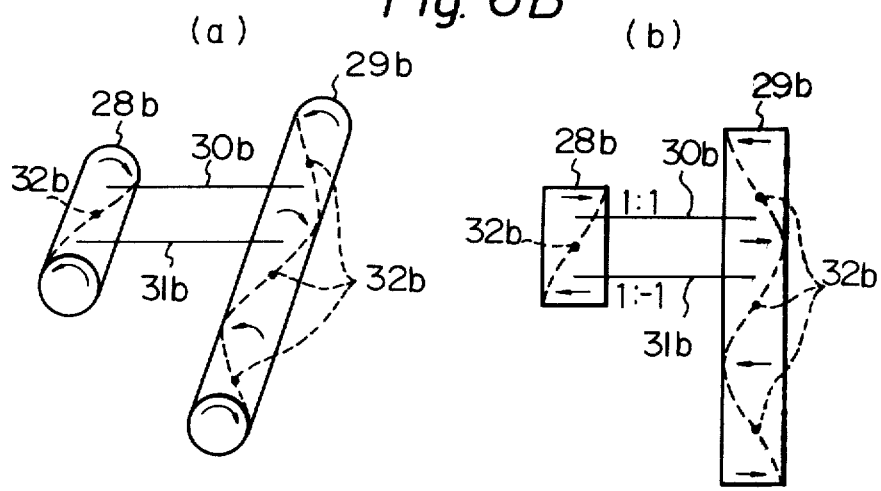
Figure 6C:
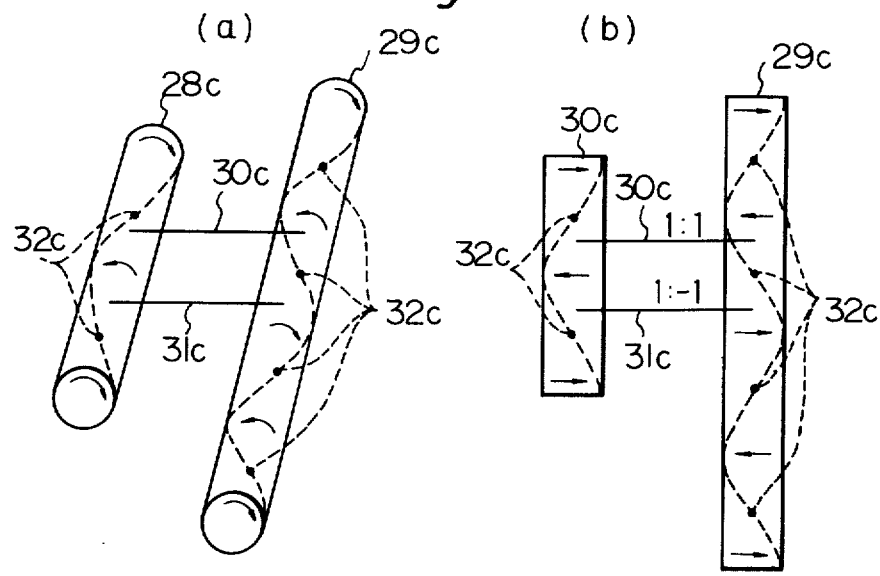

FIGS. 6A to 6C illustrate embodiments of the present invention as applied to a mechanical filter having vibrators of the torsional vibration type. In diagrams (a) and (b) of FIG. 6A, reference numeral 28a denotes a mechanical vibrator of the torsional vibration type which vibrates at the first order, 29a represents a mechanical vibrator of the torsional vibration type which vibrates at the second order, 30a denotes a coupler which longitudinally vibrates and which connects the pair of mechanical vibrators 28a and 29a in phase, 31a denotes a differential coupler which longitudinally vibrates and which connects the pair of mechanical vibrators in antiphase, and 32a denotes nodal points of the mechanical vibrators which undergo torsional vibration. Further, the dotted lines and arrows in (a) and (b) of FIG. 6A denote the mode of torsional vibration and directions of vibration, respectively. The mechanical dimensions of the mechanical vibrators have been so adjusted that the resonance frequency of the first order of the mechanical vibrator 28a is nearly equal to the resonance frequency of the second order of the mechanical vibrator 29a. Diagram (b) of FIG. 6A is a plan view of the mechanical filter of diagram (a). In this mechanical filter, the couplers 30a and 31a vibrate longitudinally in antiphase are arrayed nearly parallel to each other and are connected to the mechanical vibrators 28a and 29a nearly at right angles thereto. This arrangement enables the mechanical filter to be easily manufactured while achieving the desired.

Diagram (a) of FIG. 6B illustrates the present invention as applied to mechanical vibrators of the torsional vibration type at the order of an odd number, in which reference numeral 28b denotes a mechanical vibrator which undergoes vibration of the first order in the mode of torsional vibration, 29b denotes a mechanical vibrator which undergoes vibration of the third order in the mode of torsional vibration, 30b denotes a coupler which vibrates longitudinally and which connects the vibrators 28b and 29b in phase together, and 31b denotes a differential coupler which vibrates longitudinally and which connects the vibrators 28b and 29b in antiphase. Reference numeral 32b denotes nodal points of torsional vibration in the vibrators 28b and 29b. The dotted lines and arrows in (a) and (b) of FIG. 6B denote the mode of torsional vibration and the direction of vibration, respectively. Further, the mechanical dimensions have been so adjusted that the resonance frequency of the first order of the mechanical vibrator 28b is nearly equal to the resonance frequency of the third order of the mechanical vibrator 29b. Diagram (b) of FIG. 6B is a plan view of the mechanical filter illustrated in diagram (a) of FIG. 6A. As in seen in the diagram, the couplers 30b and 31b are nearly parallel to each other and are connected nearly at right angles to the mechanical vibrators 28b and 29b.

FIG. 6C illustrates the present invention as applied to mechanical vibrators of the torsional vibration type at the order of an even number. Diagram (a) of FIG. 6C is a perspective view of a mechanical filter according to an embodiment of the present invention, in which reference numeral 28c denotes a mechanical vibrator which undergoes vibration of the second order in the mode of torsional vibration, 29c denotes a mechanical vibrator which undergoes vibration of the fourth order in the mode of torsional vibration, 30c denotes a coupler which undergoes longitudinal vibration and which connects the vibrators 28c and 29c in phase together, and 31c denotes a differential coupler which undergoes longitudinal vibration and which connects the vibrators 28c and 29c together in antiphase. Reference numeral 32c denotes nodal points of the vibrators 28c and 29c in the torsional vibration, and the dotted lines and arrows in (a) and (b) of FIG. 6C denote the mode of torsional vibration and the directions of vibration, respectively. In FIG. 6C, the mechanical dimensions of the mechanical vibrators have been so adjusted that the resonance frequency in the vibration of the second order of the mechanical vibrator 28c is nearly equal to the resonance frequency in the vibration of the fourth order of the mechanical vibrator 29c.

Diagram (b) of FIG. 6C is a plan view of the mechanical filter illustrated in diagram (a) of FIG. 6C. As is seen in the diagram, the couplers 30c and 30c are arrayed nearly parallel to each other, and are connected nearly at right angles to the mechanical vibrators 28c and 29c.

Figure 7A:
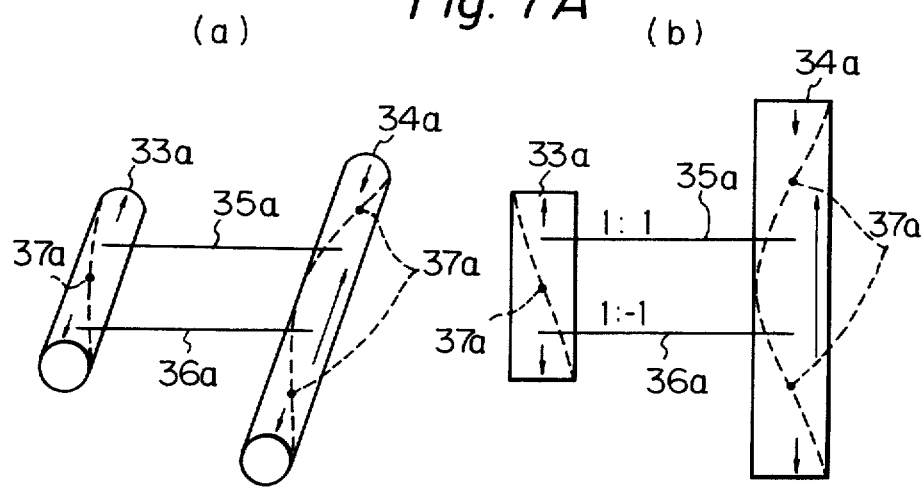
FIGS. 7A, 7B and 7C are views illustrating embodiments of the present invention as applied to a mechanical filter which has mechanical vibrators of the longitudinal vibration type.
Figure 7B:
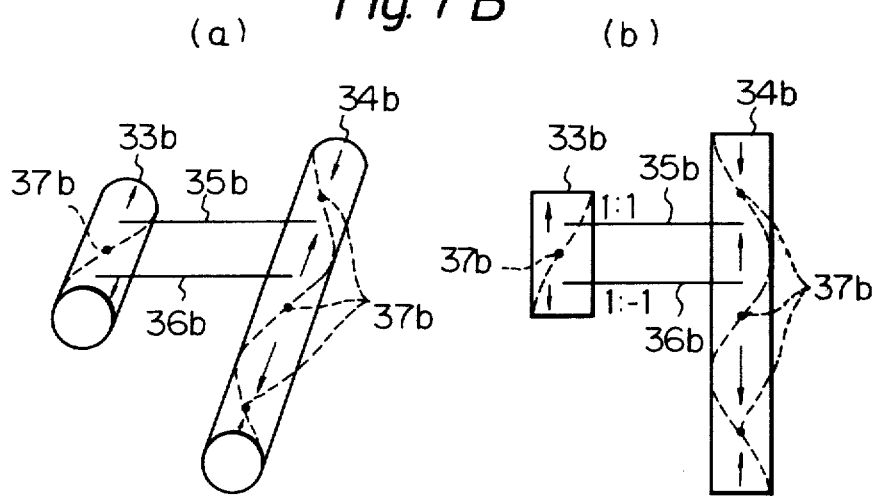
Figure 7C:
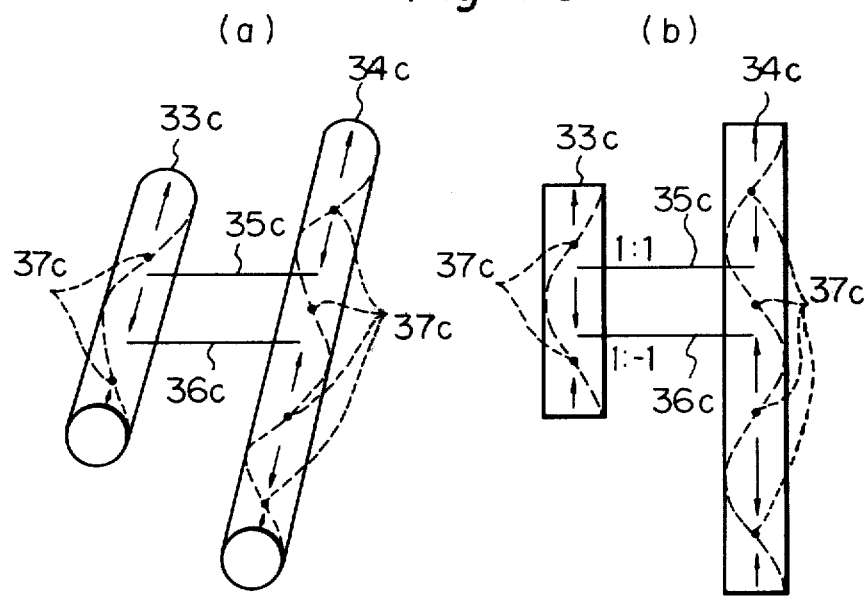

FIGS. 7A to 7C illustrate embodiments in which the present invention is applied to mechanical filters having mechanical vibrators of the longitudinal vibration type. In diagram (a) of FIG. 7A, reference numeral 33a denotes a mechanical vibrator which undergoes vibration of the first order in the mode of longitudinal vibration, 34a denotes a mechanical vibrator which undergoes vibration of the second order in the mode of longitudinal vibration, 35a denotes a coupler which undergoes flexural vibration and which is coupled to the pair of mechanical vibrators 33a and 34a in phase, 36a denotes a differential coupler which undergoes flexural vibration and which is coupled to the pair of mechanical vibrators 33a and 34a in antiphase, and 37a denotes nodal points of the mechanical vibrators which vibrate longitudinally. The dotted lines and arrows in (a) and (b) of FIG. 7A denote the mode of longitudinal vibration and the directions of vibration, respectively. Further, the mechanical dimensions of the mechanical vibrators have been so adjusted that the resonance frequency of the first order of the mechanical vibrator 33a is nearly equal to the resonance frequency of the second order of the mechanical vibrator 34a. Diagram (b) of FIG. 7A is a plan view of the mechanical filter of diagram (a) of FIG. 7A.

In the mechanical filter illustrated in FIG. 7A, the couplers 35a and 36a are arrayed nearly parallel to each other and are connected nearly at right angles to the mechanical vibrators 33a and 34a. The effects obtained by this mechanical filter are the same as the effects obtained by the mechanical filter of FIG. 6A.

FIG. 7B illustrates the present invention as applied to mechanical vibrators which vibrate at the order of an odd number and in the mode of longitudinal vibration. Diagram (a) of FIG. 7B is a perspective view of a mechanical filter according to an embodiment of the present invention, in which reference numeral 33b denotes a mechanical vibrator which undergoes vibration of the first order in the mode of longitudinal vibration, 34b denotes a mechanical vibrator which undergoes vibration of the third order in the mode of longitudinal vibration, 35b denotes a coupler which vibrates in the mode of flexural vibration and which connects the vibrators 33b and 34b in phase, and 36b denotes a differential coupler which vibrates in the mode of flexural vibration and which connects the vibrators 33b and 34b in antiphase. Reference numeral 37b denotes nodal points of the vibrators 33b and 34b in longitudinal vibration, and the dotted lines and arrows in (a) and (b) of FIG. 7B denote the mode of longitudinal vibration and directions of vibration, respectively. Further, the mechanical dimensions of the mechanical vibrators have been so adjusted that the resonance frequency of the first order of the mechanical vibrator 33b is nearly equal to the resonance frequency of the third order of the mechanical vibrator 34b. Diagram (b) of FIG. 7B is a plan view of the mechanical filter illustrated in diagram (a) of FIG. 7B. As seen in the diagram, the couplers 35b and 36b are arrayed approximately parallel to each other, and are connected approximately at right angles to the mechanical vibrators 33b and 34b.

FIG. 7C illustrates the present invention as applied to mechanical vibrators which vibrate at the order of an even number and in the mode of longitudinal vibration. Diagram (a) of FIG. 7C is a perspective view illustrating a mechanical filter according to an embodiment of the present invention, in which reference numeral 33c denotes a mechanical vibrator which undergoes vibration of the second order in the mode of longitudinal vibration, 34c denotes a mechanical vibrator which undergoes vibration of the fourth order in the mode of longitudinal vibration, 35c denotes a coupler which vibrates in the mode of flexural vibration and which connects the vibrators 33c and 34c in phase, and 36c denotes a differential coupler which vibrates in the mode of flexural vibration and which connects the vibrators 33c and 34c in antiphase. Reference numeral 37c denotes nodal points of the vibrators 33c and 34c in the longitudinal vibration. The dotted lines and arrows in (a) and (b) of FIG. 7C denote the mode of longitudinal vibration and directions of vibration, respectively. Further, the mechanical dimensions of the mechanical filters have been so adjusted that the resonance frequency of the second order of the mechanical vibrator 33c is nearly equal to the resonance frequency of the fourth order of the mechanical vibrator 34c. Diagram (b) of FIG. 7C is a plan view of the mechanical filter illustrated in diagram (a) of FIG. 7C. As is seen in the diagram, the couplers 35c and 36c are arrayed approximately parallel to each other, and are connected approximately at right angles to the mechanical vibrators 33c and 34c.

Figure 8A:
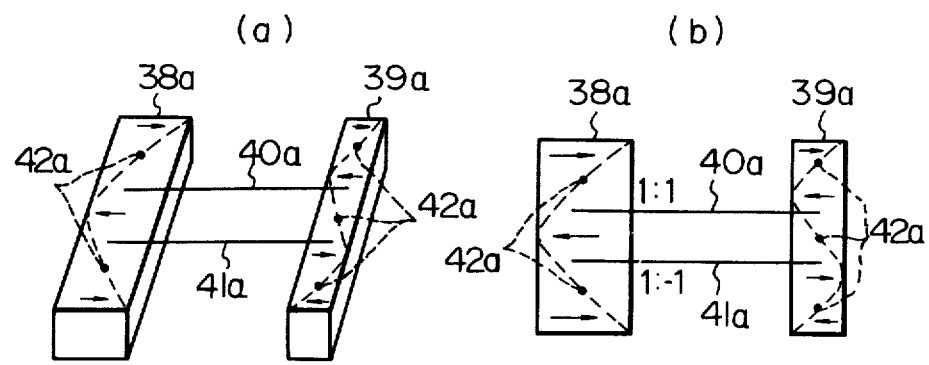
FIGS. 8A, 8B and 8C are views illustrating emboidments of the present invention as applied to a mechanical filter which has mechanical vibrators of the flexural vibration type.
Figure 8B:
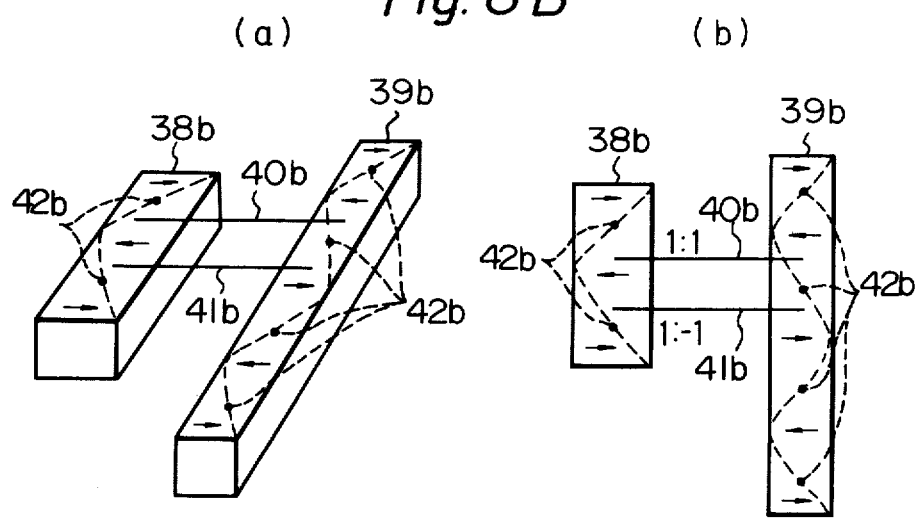
Figure 8C:
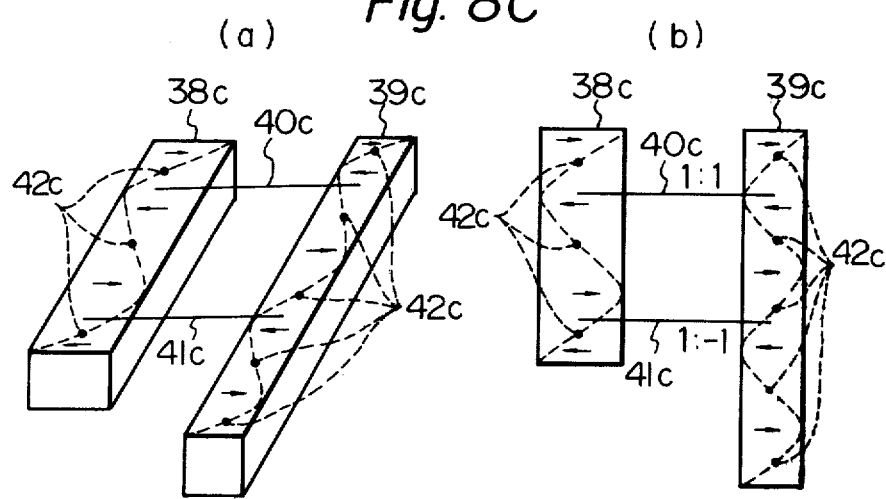

FIGS. 8A to 8C illustrate embodiments of the present invention as applied to mechanical filters having mechanical vibrators of the flexural vibration type. In diagram (a) of FIG. 8A, reference numeral 38a denotes a mechanical vibrator which undergoes vibration of the first order in the mode of flexural vibration, 39a denotes a mechanical vibrator which undergoes vibration of the second order in the mode of flexural vibration, 40a denotes a coupler which vibrates longitudinally and which connects the pair of mechanical vibrators 38a and 39a in phase, 41a denotes a differential coupler which vibrates longitudinally and which connects the pair of mechanical vibrators in antiphase, and 42a denotes nodal points of the mechanical vibrators which vibrate in the mode of flexural vibration. The dotted lines and arrows in (a) and (b) of FIG. 8A denote the mode of flexural vibration and directions of vibration, respectively. Further, the mechanical dimensions of the mechanical vibrators have been so adjusted that the resonance frequency of the first order of the mechanical vibrator 38a is nearly equal to the resonance frequency of the second order of the mechanical vibrator 39a. Diagram (b) of FIG. 8A is a plan view of the mechanical filter illustrated in diagram (a) of FIG. 8A. In this mechanical filter, the couplers 40a and 41a are arrayed approximately parallel to each other and are connected approximately at right angles to the mechanical vibrators 38a and 39a. The mechanical filter illustrated in FIG. 8A has the same effect as the mechanical filters in FIGS. 6A and 7A.

FIG. 8B illustrates an embodiment of the present invention as applied to the mechanical vibrators which undergo vibration at the order of an odd number and in the mode of flexural vibration. Diagram (a) of FIG. 8B is a perspective view illustrating a mechanical filter according to an embodiment of the present invention, in which reference numeral 38b denotes a mechanical vibrator which undergoes vibration of the first order in the mode of flexural vibration, 39b denotes a mechanical vibrator which undergoes vibration of the third order in the mode of flexural vibration, 40b denotes a coupler connected to the vibrators 38b and 39b in phase, and 41b denotes a differential coupler connected to the vibrators 38b and 39b in antiphase. Further, reference numeral 42b denotes nodal points of the vibrators 38b and 39b in the flexural vibration, and the dotted lines and arrows in (a) and (b) of FIG. 8B denote the mode of flexural vibration and directions of vibration, respectively. The mechanical dimensions have been so adjusted that the resonance frequency of the first order of the mechanical vibrator 38b is nearly equal to the resonance frequency of the third order of the mechanical vibrator 39b. Diagram (b) of FIG. 8B is a plan view of the mechanical filter illustrated in diagram (a) of FIG. 8B. As seen in the drawing, the couplers 40b and 41b are arrayed approximately parallel to each other, and are connected approximately at right angles to the mechanical vibrators 38b and 39b.

FIG. 8C illustrates the present invention as applied to the mechanical vibrators which undergo vibration at the order of an even number and in the mode of flexural vibration. Diagram (a) of FIG. 8C is a perspective view illustrating a mechanical filter of the present invention, in which reference numeral 38c denotes a mechanical vibrator which undergoes vibration of the second order in the mode of flexural vibration, 39c denotes a mechanical vibrator which undergoes vibration of the fourth order in the mode of flexural vibration, 40c denotes a coupler which connects the vibrators 38c and 39c in phase, 41c denotes a differential coupler which connects the vibrators 38c and 39c in antiphase, and 42c denotes nodal points of the vibrators 38c and 39c in the flexural vibration. The dotted lines and arrows in (a) and (b) of FIG. 8C denote the mode of flexural vibration and directions of vibration, respectively. Further, the mechanical dimensions of the mechanical vibrators have been adjusted so that the resonance frequency of the second order of the mechanical vibrator 38c is nearly equal to the resonance frequency of the fourth order of the mechanical vibrator 39c.

Diagram (b) of FIG. 8C is a plan view of the mechanical filter illustrated in diagram (a) of FIG. 8C. As seen in the diagram, the couplers 40c and 41c are arrayed parallel to each other and are connected at right angles to the mechanical vibrators 38c and 39c.

Figure 9A:
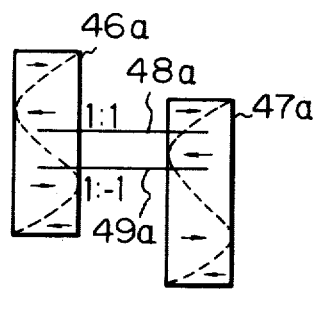
FIGS. 9A and 9B are views illustrating embodiments of the present invention as applied to a mechanical filter which has mechanical vibrators which vibrate at the same order of number.

The present invention can be applied even when the mechanical vibrators which form the mechanical filter vibrate at the order of the same number. FIG. 9A illustrates an embodiment in which the two vibrators undergo vibration of the second order. Reference numerals 46a and 47a denote vibrators which undergo vibration of the second order in the mode of flexural vibration, 48a denotes a coupler for coupling the two vibrators in phase, and 49a denotes a coupler for coupling the two vibrators in antiphase. The dotted lines and arrows in FIG. 9A denote the mode of flexural vibration and directions of vibration, respectively.

Figure 9B:
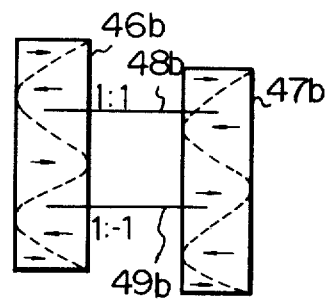

FIG. 9B illustrates an embodiment in which the two mechanical vibrators undergo vibration of the third order. Reference numerals 46b and 47b denote vibrators which undergo vibration of the third order in the mode of flexural vibration, 48b denotes a coupler for coupling the two vibrators in phase, and 49b denotes a coupler for coupling the two vibrators in antiphase. Further, the dotted lines and arrows denote the mode of flexural vibration and directions of vibration, respectively. Thus, even when the two vibrators vibrate at the order of the same number, the mechanical filter can be constructed by deviating the arrangement of the two vibrators and by connecting the couplers nearly at right angles in phase and in antiphase.

Figure 10:
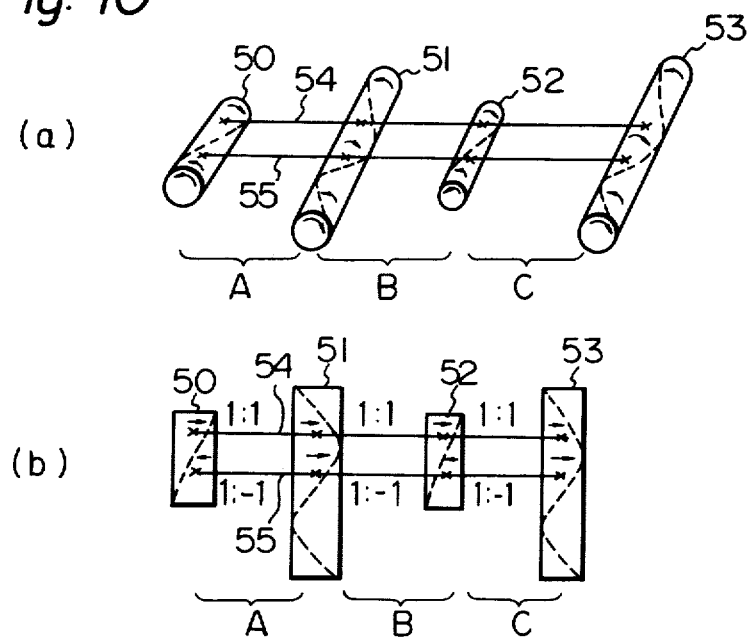
FIG. 10 is a view illustrating an embodiment of the present invention as applied to a narrow-band mechanical filter.

FIG. 10 illustrates a mechanical filter according to an embodiment of the present invention. Diagram (a) of FIG. 10 is a perspective view illustrating the mechanical filter of that embodiment and diagram (b) of FIG. 10 is a plan view thereof. In the two diagrams, reference numerals 50 and 52 denote mechanical vibrators which undergo vibration of the first order in the mode of torsional vibration, reference numerals 51 and 53 denote mechanical vibrators of the third order in the mode of torsional vibration, 54 denotes a coupler for connecting the vibrators in phase, and 55 denotes a coupler for connecting the vibrators in antiphase with respect to each other.

In the embodiment of FIG. 10, essentially two sets of mechanical filters as illustrated in FIG. 6B are connected in cascade, and the coupling method which is a feature of the present invention is applied between the vibrator 50 and the vibrator 51 (illustrated by A in the drawing), between the vibrator 51 and the vibrator 52 (illustrated by B in the drawing), and between the vibrator 52 and the vibrator 53 (illustrated by C in the drawing). Although FIG. 10 illustrates the case in which the vibrators vibrate in the mode of torsional vibration, the embodiment illustrated in FIG. 10 is also applicable even when the vibrators vibrate in the mode of longitudinal vibration or flexural vibration.

In the above-mentioned embodiments, it is assumed that the phase of vibration is not changed by using the coupler. In practice, however, the phase may change or may not change depending upon the length of the couplers. In order for the phase not to be changed by the couplers, the couplers should have lengths within the range as defined below.

$$n\lambda < l < (n + \tfrac{1}{2})\lambda \qquad (5)$$

where $\lambda$ represents a wave length ($\lambda = v/f$), f represents a frequency, v represents a propagation velocity of the couplers, and n is 0, 1, 2, . . . .

Furthermore, the present invention can be applied even when a pole-type mechanical filter is to be constructed. The pole-type mechanical filter consists of at least three or more mechanical vibrators and a main coupler connecting these mechanical vibrators in phase, wherein one mechanical vibrator and another nonadjacent mechanical vibrator are connected together in phase or in antiphase using another bridging coupler.

In the pole-type mechanical filter, one or two mechanical vibrators are usually arranged between the two mechanical vibrators that are connected by the above-mentioned bridging coupler. For instance, when one mechanical vibrator is interposed between the two mechanical vibrators, the pole will appear on the higher side in the pass band if the bridging coupler is connected in phase, and the pole will appear on the lower side if the bridging coupler is connected in antiphase. When two mechanical vibrators are interposed between the mechanical vibrators, the poles will appear on the higher side and on the lower side in the pass band if the bridging couplers are connected in antiphase to each other.

A pole-type mechanical filter can thus be constructed using a bridging coupler. The pole-type construction of the mechanical filter is advantageous in regard to enhancing the selectivity of the filter and enhancing the characteristics of group delay time, which have heretofore been regarded as conflicting natures, and in regard to reducing the size of the mechanical filter. In general, if the number of elements constituting the filter is increased, the selectivity is increased but also the group delay time is increased. Further, the increase in the number of elements causes the filter itself to be bulky. With the pole-type mechanical filter, the number of elements can be greatly reduced while satisfying the abovementioned characteristics, so that the size of the mechanical filter can also be reduced.

Several types of pole-type mechanical filters have already been proposed. Depending upon their construction, they can be roughly divided into two groups.

Figure 11:
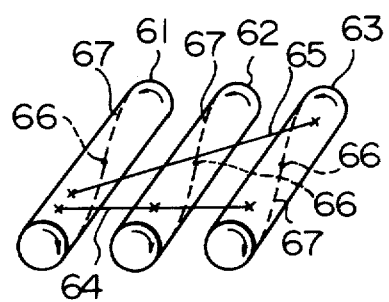
FIGS. 11 and 12 are views illustrating conventional pole-type mechanical filters.

FIG. 11 is a perspective view illustrating a conventional pole-type mechanical filter employing three mechanical vibrators of the torsional vibration type. In FIG. 11, reference numerals 61, 62 and 63 denote mechanical vibrators which vibrate at the first order, 64 denotes a main coupler for coupling the mechanical vibrators 61, 62 and 63 in phase, and 65 denotes a bridging coupler which couples the mechanical vibrators 61 and 63 in antiphase jumping the mechanical vibrator 62. Reference numerals 66 and 67 denote nodal points in the torsional vibration of the first order and the displaced position due to the vibration, respectively. In the mechanical filter illustrated in FIG. 11, the main coupler 64 is connected nearly at right angles to the mechanical vibrators 61, 62 and 63, whereas the bridging coupler 65 is connected in a tilted or diagonal manner with respect to the mechanical vibrators 61 and 63. In FIG. 11, the mechanical vibrators are coupled at points where the direction of displacement in the torsional vibration of the first order is reversed with respect to each other, so that the coupling of the opposite phase can be obtained. In this mechanical filter, the pole appears on the lower side in the pass band.

The advantage of the pole-type mechanical filter of the type illustrated in FIG. 11 is that all of the mechanical vibrators vibrate in the same mode of vibration and at the same order. Consequently, the mechanical vibrators can have nearly the same size and shape; only a single type of mechanical vibrator need be prepared to assemble the filters. The thus constructed pole-type mechanical filter, however, has a bridging coupler which connects the mechanical vibrators in a tilted manner, and presents a difficulty from the standpoint of manufacture as well as a difficulty in maintaining dimensional precision.

Figure 12:
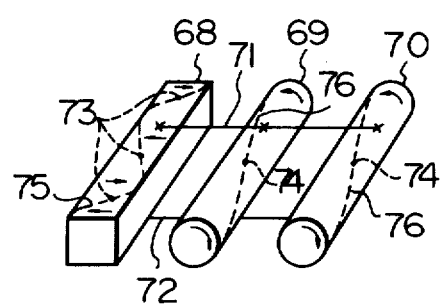

FIG. 12 is a perspective view illustrating a conventional pole-type mechanical filter employing mechanical vibrators of the flexural vibration type and mechanical vibrators of the torsional vibration type. In FIG. 12, reference numeral 68 denotes a mechanical vibrator which undergoes flexural vibration of the second order, 69 and 70 denote mechanical vibrators which undergo torsional vibration of the first order, 71 denotes a main coupler for coupling the mechanical vibrators 68, 69 and 70 in phase, and 72 denotes a bridging coupler for coupling the mechanical vibrators 68 and 70 in antiphase. Reference numerals 73 and 74 denote nodal points in the flexural vibration of the second order and in the torsional vibration of the first order, respectively, and 75 and 76 denote displacements in vibration. In this mechanical filter, also, the pole appears on the lower side in the pass band.

The advantage of the pole-type mechanical filter of the type illustrated in FIG. 12 is that the couplers can be easily welded because the two couplers 71 and 72 are arrayed nearly at right angles to the mechanical vibrators 68, 69 and 70, and further, the construction is relatively simple which facilitates the manufacturing operation. With the thus constructed pole-type mechanical filter, however, mechanical vibrators having different modes of vibration must be prepared in different mechanical shapes and dimensions. Furthermore, two types of mechanical vibrators made of different materials must be prepared for the purpose of satisfying the requirements from the standpoints of frequency temperature coefficients. Moreover, the two couplers must be connected to both surfaces of the mechanical vibrators.

Figure 13:
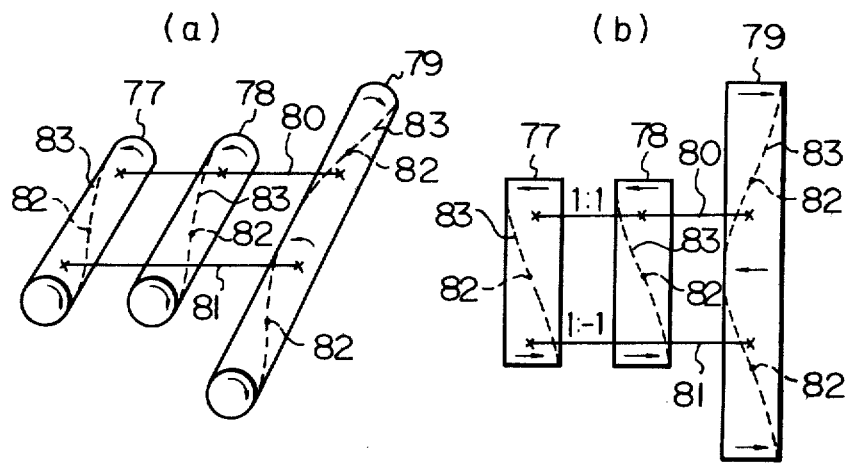
FIGS. 13, 14 and 15 are views illustrating embodiments of the present invention as applied to pole-type mechanical filters.

FIG. 13 is a diagram illustrating a pole-type mechanical filter according to an embodiment of the present invention. The diagram illustrates the present invention as applied to a mechanical filter composed of mechanical vibrators of the torsional vibration type. Diagram (a) of FIG. 13 is a perspective view illustrating a pole-type mechanical filter according to the embodiment, in which reference numerals 77 and 78 denote mechanical vibrators which undergo torsional vibration of the first order, 79 denotes a mechanical vibrator which undergoes torsional vibration of the second order, 80 denotes a main coupler which longitudinally vibrates and which couples together the mechanical vibrators 77, 78 and 79 in phase, 81 denotes a bridging coupler which longitudinally vibrates and which couples together the mechanical vibrators 77 and 79 in antiphase, and 82 and 83 denote nodal points of the mechanical vibrators in the torsional vibration and displacements in vibration, respectively. Further, the arrows denote the directions of displacement, and the marks x denote the connecting points between the couplers and the mechanical vibrators. In FIG. 13, the mechanical dimensions of the mechanical vibrators have been so adjusted that the resonance frequency of the first order of the mechanical vibrators 77 and 78 is nearly equal to the resonance frequency of the second order of the mechanical vibrator 79.

Diagram (b) of FIG. 13 is a plan view of the mechanical filter illustrated in diagram (a) of FIG. 13. As seen in the diagram, the couplers 80 and 81 are arrayed nearly parallel to each other and nearly at right angles to the mechanical vibrators 77, 78 and 79.

Figure 14:
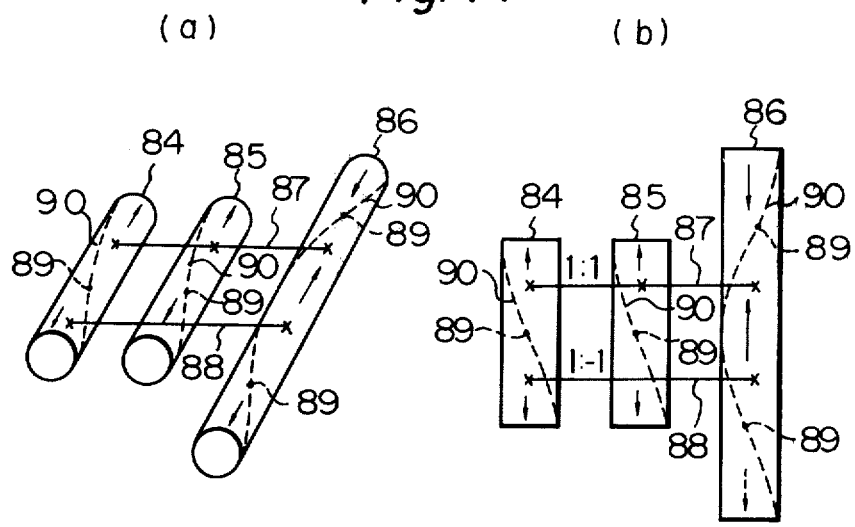

FIG. 14 illustrates a pole-type mechanical filter according to another embodiment of the present invention. FIG. 14 illustrates the present invention as applied to a mechanical filter composed of mechanical vibrators of the longitudinal vibration type. Diagram (a) of FIG. 14 is a perspective view illustrating a pole-type mechanical filter according to the embodiment in which reference numerals 84 and 85 denote mechanical vibrators which undergo longitudinal vibration of the first order, 86 denotes a mechanical vibrator which undergoes longitudinal vibration of the second order, 87 denotes a main coupler which undergoes flexural vibration and which couples together the mechanical vibrators 84, 85 and 86 in phase, 88 denotes a bridging coupler which undergoes flexural vibration and which couples together the mechanical vibrators 84 and 86 in antiphase, and 89 and 90 denote nodal points of the mechanical vibrators in the mode of longitudinal vibration and displacements in vibration, respectively. Further, the arrows denote the directions of displacement and the marks x denote the points where the couplers and mechanical vibrators are connected together. In FIG. 14, the mechanical dimensions of the mechanical vibrators have been so adjusted that the resonance frequency of the first order of the mechanical vibrators 84 and 85 are nearly equal to the resonance frequency of the second order of the mechanical vibrator 86.

Diagram (b) of FIG. 14 is a plan view of the mechanical filter illustrated in diagram (a) of FIG. 14. As seen in the diagram, the couplers 87 and 88 are arrayed nearly parallel to each other and nearly at right angles to the mechanical vibrators 84, 85 and 86.

Figure 15:
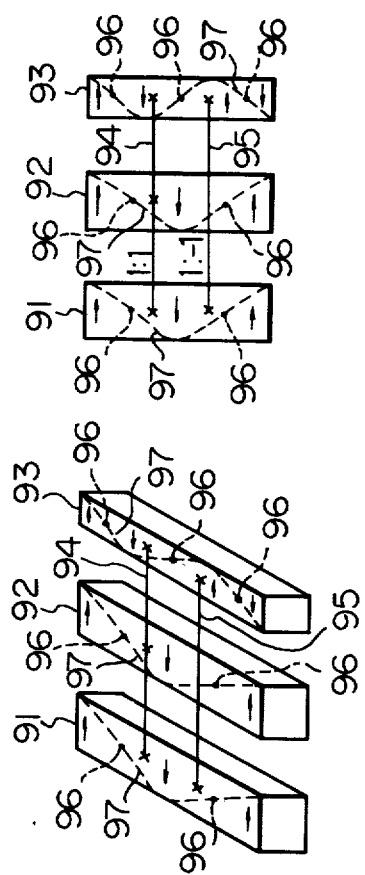

FIG. 15 illustrates a pole-type mechanical filter according to a third embodiment of the present invention and represents the present invention as applied to a mechanical filter composed of mechanical vibrators of the flexural vibration type. Diagram (a) of FIG. 15 is a perspective view illustrating a pole-type mechanical filter according to the embodiment in which reference numerals 91 and 92 denote mechanical vibrators which undergo flexural vibration of the first order, 93 denotes a mechanical vibrator which undergoes flexural vibration of the second order, 94 denotes a main coupler which vibrates longitudinally and which couples together the mechanical vibrators 91, 92 and 93 in phase, 95 denotes a bridging coupler which vibrates longitudinally and which couples together the mechanical vibrators 91 and 93 in antiphase, and 96 and 97 denote nodal points of the mechanical vibrators in the mode of flexural vibration and displacements in vibration, respectively. Further, the arrows indicate directions of displacement, and the marks x denote points where the couplers and mechanical vibrators are connected together. The mechanical dimensions have been so adjusted that the resonance frequency of the first order of the mechanical vibrators 91 and 92 is nearly equal to the resonance frequency of the second order of the mechanical vibrator 93.

Diagram (b) of FIG. 15 is a plan view of the mechanical filter illustrated in diagram (a) of FIG. 15. As is seen in the diagram, the couplers 94 and 95 are arrayed nearly parallel to each other, and nearly at right angles to the mechanical vibrators 91, 92 and 93.

According to the present invention as illustrated in the foregoing, the pole-type mechanical filter can be constructed using mechanical vibrators which vibrate in the same mode of vibration and which are made of the same material. Further, since the main coupler which transmits the signals in phase and the bridging coupler which forms an attenuation pole are arrayed neary at right angles with respect to the mechanical vibrators, the filter can be easily manufactured while maintaining increased precision.

The foregoing embodiments have dealt with cases in which the invention was applied to mechanical filters composed of three representative types of mechanical vibrators which undergo torsional vibration, longitudinal vibration and flexural vibration. The present invention, however, is by no means restricted to the above-mentioned embodiments only, but may also be applied to mechanical filters composed of mechanical vibrators of any type of vibration. Further, the aforementioned embodiments have dealt with cases where mechanical vibrators of the first order of vibration and mechanical vibrators of the second order of vibration were employed. The invention, however, is by no means limited to the above-mentioned cases only, but may also be applied to combinations of any orders of vibration of a pair of mechanical vibrators coupled by the bridging coupler except a combination of vibrations of the first order.

Furthermore, in the above-mentioned embodiments, an attenuation pole is provided on the lower side in the pass band. The invention, however, is by no means limited to the above-mentioned embodiments only. For example, when two mechanical vibrators are provided between the mechanical vibrators that are connected by a bridging coupler, an attenuation pole may be provided on the lower side and on the higher side in the pass band, respectively. It is further possible to provide a plurality of poles by partially applying a plurality of bridging couplers illustrated in the foregoing embodiments to the mechanical filter made up of many elements. Further, of course, the mechanical vibrators constituting the mechanical filter may be either resonators or transducers.

According to the mechanical filter of the present invention as illustrated in the foregoing, the two couplers, including a differential coupler, can be connected to a pair of mechanical vibrators at right angles therewith. Furthermore, since the pair of mechanical vibrators vibrate in the same mode of vibration, and the two couplers are connected to only one surface of each of the mechanical vibrators, the mechanical filters can be easily manufactured while maintaining a high degree of precision.

The foregoing embodiments have illustrated the present invention as applied to several representative types of vibration. The invention, however, is not restricted to the aforementioned types of vibration only, but may also be applied to virtually any type of vibration.

What is claimed is:

1. A mechanical filter comprising at least a pair of mechanical vibrators which are so arrayed that their longitudinal axes are substantially parallel to each other and which vibrate in the same mode of vibration, a first coupler which is arrayed at substantially right angles to said pair of mechanical vibrators together in phase, and a second coupler which is arrayed at substantially right angles to said pair of mechanical vibrators and couples said pair of mechanical vibrators together in antiphase, and wherein the first and second couplers are connected to said pair of mechanical vibrators on mutually corresponding side surfaces of said pair of mechanical vibrators, and wherein the phase of both said first coupler and said second coupler does not change between said pair of said mechanical vibrators.

2. A mechanical filter according to claim 1, wherein said at least a pair of mechanical vibrators consist of a first mechanical vibrator and a second mechanical vibrator.

3. A mechanical filter according to claim 1, wherein one of the mechanical vibrators of said pair vibrates at the order of an odd number, and the other one vibrates at the order of an even number.

4. A mechanical filter according to claim 1, wherein both of the mechanical vibrators of said pair vibrate at the order of an odd number or an even number.

5. A mechanical filter according to claim 1, wherein the pair of first and second couplers is connected to the same mutually corresponding side surfaces of said pair of mechanical vibrators.

6. A mechanical filter according to claim 1 or 5, wherein the in phase and antiphase coupling of said pair of mechanical vibrators is achieved by changing the vibration order of the mechanical vibrators.

7. A mechanical filter according to claim 1 or 5, wherein the in phase and antiphase coupling of said pair of mechanical vibrators is formed by shifting the position of said pair of mechanical vibrators with respect to each other.

8. A pole-type mechanical filter comprising at least three or more mechanical vibrators which are so arrayed that their longitudinal axes are substantially parallel to each other, a first coupler for coupling each of the mechanical vibrators together in phase and is arrayed at substantially right angles to the mechanical vibrators, and a second coupler for coupling a pair of nonadjacent mechanical vibrators in antiphase and is arrayed at substantially right angles to the coupled vibrators, wherein said coupled nonadjacent mechanical vibrators vibrate in the same mode of vibration and have substantially the same resonance frequencies.

9. A mechanical filter according to claim 8 comprising first, second and third mechanical vibrators, and wherein said first coupler is coupled to said first, second and third mechanical vibrators in phase, and said second coupler is coupled to said first and third mechanical vibrators in a jumping manner and in antiphase.

10. A mechanical filter according to claim 8 comprising first, second, third and fourth mechanical vibrators, and wherein said first coupler is coupled to said first, second, third and fourth mechanical vibrators in phase, and said second coupler is coupled to said first and fourth mechanical vibrators in a jumping manner and in antiphase.

11. The pole-type mechanical filter of claim 8 wherein the first and second couplers are connected to the mechanical vibrators on the surface of only one side of the vibrators.

12. The pole-type mechanical filter of claim 8 wherein the mechanical vibrators have substantially the same resonance frequencies.

13. A mechanical filter according to claim 1 or 8 wherein said same mode of vibration is a torsional vibration mode.

14. A mechanical filter according to claim 1 or 8 wherein said same mode of vibration is a bending vibration mode.

15. A mechanical filter according to claim 1 or 8 wherein said same mode of vibration is a longitudinal vibration mode.

* * * * *